(12) United States Patent
Fukuda et al.

(10) Patent No.: US 7,315,915 B2
(45) Date of Patent: Jan. 1, 2008

(54) NON-VOLATILE SEMICONDUCTOR MEMORY DEVICE AND ELECTRIC DEVICE WITH THE SAME

(75) Inventors: Yasuyuki Fukuda, Yokohama (JP); Masatsugu Kojima, Yokohama (JP); Kenichi Imamiya, Tokyo (JP); Koji Hosono, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 339 days.

(21) Appl. No.: 10/950,416

(22) Filed: Sep. 28, 2004

(65) Prior Publication Data

US 2005/0111259 A1 May 26, 2005

(30) Foreign Application Priority Data

Oct. 15, 2003 (JP) ............................. 2003-355139

(51) Int. Cl.
*G06F 12/00* (2006.01)
(52) U.S. Cl. ................................................... 711/103
(58) Field of Classification Search ................ 711/103
See application file for complete search history.

(56) References Cited

U.S. PATENT DOCUMENTS

| | | | |
|---|---|---|---|
| 5,428,569 A | | 6/1995 | Kato et al. |
| 5,457,658 A | * | 10/1995 | Niijima et al. .............. 365/218 |
| 5,485,595 A | * | 1/1996 | Assar et al. ................. 711/103 |
| 5,544,356 A | * | 8/1996 | Robinson et al. ........... 707/205 |
| 5,841,699 A | * | 11/1998 | Miyauchi ............... 365/185.33 |
| 5,963,970 A | * | 10/1999 | Davis .......................... 711/103 |
| 6,175,517 B1 | * | 1/2001 | Jigour et al. .................. 365/63 |
| 6,513,095 B1 | * | 1/2003 | Tomori ....................... 711/103 |
| 6,591,329 B1 | * | 7/2003 | Kakinuma et al. .......... 711/103 |
| 2003/0133338 A1 | * | 7/2003 | Kanda et al. ............... 365/200 |
| 2004/0039870 A1 | * | 2/2004 | Roohparvar ................ 711/103 |
| 2005/0047216 A1 | | 3/2005 | Kojima |
| 2005/0144357 A1 | * | 6/2005 | Sinclair ....................... 711/103 |
| 2005/0144363 A1 | * | 6/2005 | Sinclair ....................... 711/103 |
| 2005/0144367 A1 | * | 6/2005 | Sinclair ....................... 711/103 |

FOREIGN PATENT DOCUMENTS

JP      8-153398      6/1996

OTHER PUBLICATIONS

U.S. Appl. No. 11/227,516, filed Sep. 16, 2005, Tanaka.
U.S. Appl. No. 11/610,193, filed Dec. 13, 2006, Fukuka et al.

* cited by examiner

*Primary Examiner*—Matthew Kim
*Assistant Examiner*—Ryan Dare
(74) *Attorney, Agent, or Firm*—Oblon, Spivak, McClelland, Maier & Neustadt, P.C.

(57) ABSTRACT

A non-volatile semiconductor memory device includes: a cell array having electrically rewritable and non-volatile memory cells arranged therein, the cell array being divided into a plurality of blocks, each the block being divided into a plurality of sub-blocks each having one or plural and continuous pages; and a controller for controlling data erasure of the cell array in a way that each the sub-block serves as a unit of data erasure, wherein each the sub-block in the cell array stores the number of data erasure which is renewed by each data erasure, and the number of data erasure is limited for each the sub-block to a permissible maximum value stored in a certain block in the cell array.

15 Claims, 8 Drawing Sheets

NON-VOLATILE SEMICONDUCTOR MEMORY DEVICE AND ELECTRIC DEVICE WITH THE SAME

CROSS-REFERENCE TO RELATED APPLICATION

This application is based on and claims the benefit of priority from the prior Japanese Patent Application No. 2003-355139, filed on Oct. 15, 2003, the entire contents of which are incorporated herein by reference.

BACKGROUND OF THE INVENTION

1. Field of the Invention

This invention relates to an electrically rewritable and non-volatile semiconductor memory device (EEPROM) and an electric device with the same.

2. Description of Related Art

Currently known EEPROMs are mostly formed of memory cells with floating gates for storing data charge. A cell array of a NAND-type flash memory, which is known as one of such the EEPROMs, is formed of NAND cell units arranged therein, each of which has a plurality of memory cells connected in series. Source and drain diffusion layers of the memory cells in the NAND cell unit are shared with adjacent cells. To increase the capacity of the NAND-type flash memory, it is effective to increase the number of cells in the NAND cell unit, thereby increasing the capacity of a block defined as a group of a plurality of NAND cell units sharing a word line with them.

If only a small amount of data is written in a block of the NAND-type flash memory, the remaining area of the block becomes wasteful. In consideration of this point, in practice, one block is often divided into some file areas, and the data control is performed by each file area. However, data erase is usually performed as one block being rendered a data erase unit in the conventional NAND-type flash memory. Therefore, if above described data control is performed while the above-described erasing scheme is used, it takes an extra time for data rewriting.

In detail, assume, for example, that a data A area and data B area are defined in a block. In order to replace the data A by data A', it is required to do copy-write the data B into another block. After this copy-write, block erasure is performed, and then data A' is written into the erased block. Such a need to copy-write the data B, which is not required to be rewritten, brings an overhead time in data processing.

To decrease such the overhead time in the data rewriting operation, it is effective to do a data erase operation by every page or every sub-block (i.e., group of plural pages which are continued). Such the erase method has already been provided in, for example, Japanese Patent Application Laid Open (kokai) No. 3-295097, Japanese Patent Application Laid Open (kokai) No. 8-143398, and Japanese Patent Application Laid Open (kokai) No. 11-176177.

Sub-block erasure may be done by applying 0V to word lines in a selected sub-block, and simultaneously applying an erase voltage to a p-type well on which the cell array is formed, while setting word lines in a non-selected sub-block at a floating state. Under such the condition, stored charge in the respective floating gates is discharged to the channels by FN tunneling in the memory cells in the selected sub-block, whereby an erase state with a low threshold voltage (i.e., data "1" state) is obtained in every selected cell. In the non-selected sub-block, the word lines (i.e., control gates), which are held in a floating state, are boosted by capacitive coupling in accordance with increasing of the erase voltage applied to the p-well to be in an "erase-inhibition" state. Therefore, by use of such the erase method, it becomes possible to do data write for only a selected area in a block, which is required to be rewritten.

In the above-described sub-block erasure, however, there is a problem that an erase stress is applied to cells in a non-selected sub-block. Especially, within the non-selected sub-block, a large erase stress is applied to cells along a non-selected word line adjacent to the selected sub-block. This is because that the non-selected word line (in a floating state of, e.g., Vdd) adjacent a selected word line (e.g., 0V) is not boosted to a sufficient erase-inhibition voltage under the influence of capacitive coupling therebetween. As cells and interconnections are more miniaturized, and the capacitance between the word lines becomes larger, the above-described influence becomes greater. In addition, at data write time for a selected page, write stress is applied to non-selected cells because an intermediate voltage is applied to word lines of non-selected pages.

Therefore, repeatedly performing data rewrite by a sub-block, data disturbance becomes large, and there is generated a risk of data destruction. To prevent cell data from being destroyed, it is required to limit the number of data rewrite operations.

SUMMARY OF THE INVENTION

According to an aspect of the present invention, there is provided a non-volatile semiconductor memory device including:

a cell array having electrically rewritable and non-volatile memory cells arranged therein, the cell array being divided into a plurality of blocks, each the block being divided into a plurality of sub-blocks each having one or plural and continuous pages; and a controller for controlling data erasure of the cell array in a way that each the sub-block serves as a unit of data erasure, wherein each the sub-block in the cell array stores own the number of data erasure which is renewed by each data erasure, and the number of data erasure is limited for each the sub-block to a permissible maximum value stored in a certain block in the cell array.

DETAILED DESCRIPTION OF THE EMBODIMENTS

Illustrative embodiments of this invention will be explained with reference to the accompanying drawings below.

Figure 1:
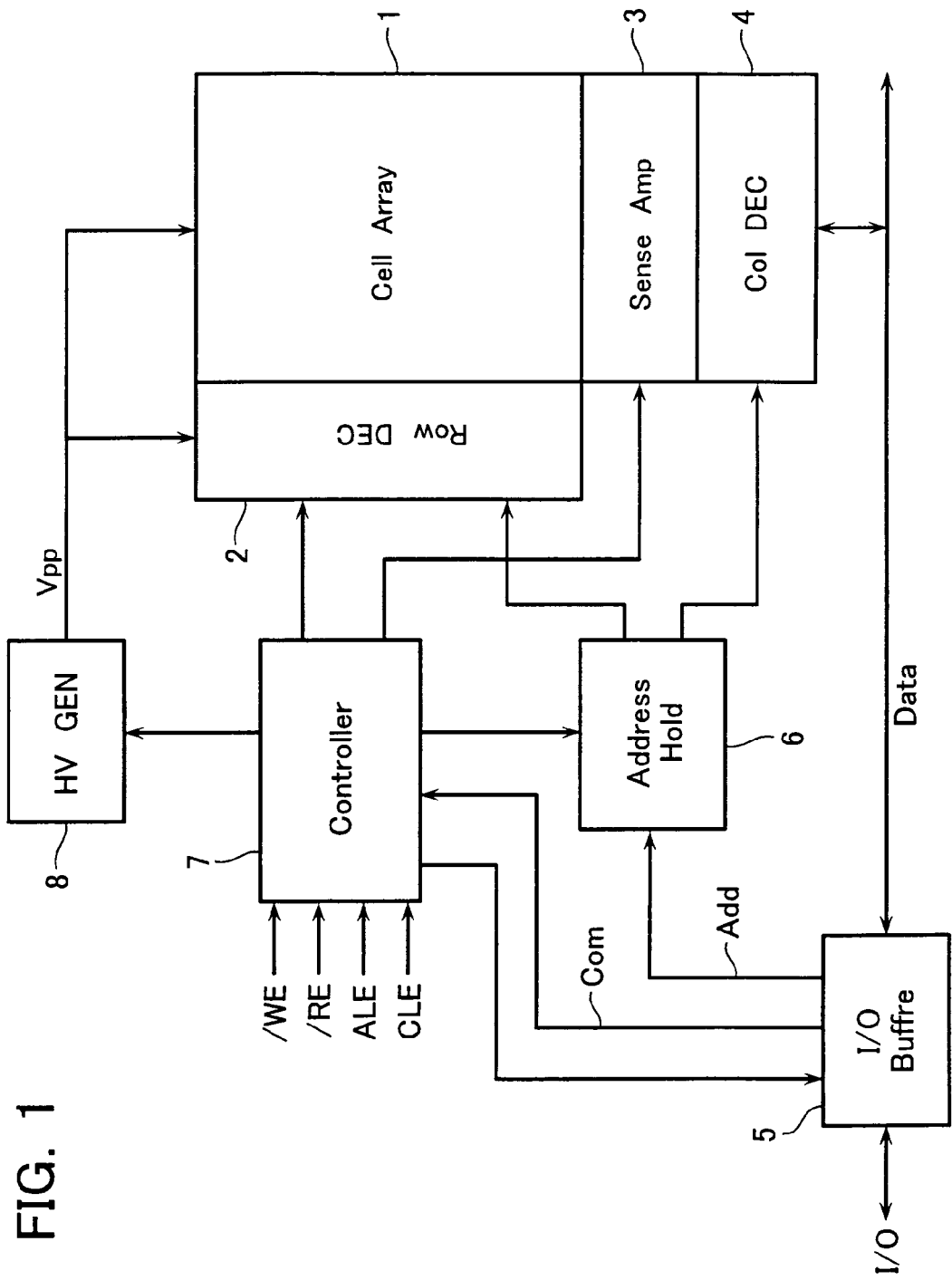
FIG. 1 shows a functional configuration of a flash memory in accordance with an embodiment of the present invention.

FIG. 1 shows a functional block configuration of a NAND-type flash memory in accordance with an embodiment. Arranging a plurality of floating-gate type non-volatile memory cells MC0-MC31 in a matrix manner, a cell array 1 is formed. A row decoder circuit (including word line driver) 2 is disposed for selecting and driving word lines and select gate lines of the cell array 1. A sense amplifier circuit 3 has sense amplifiers and data latch circuits so as to constitute a page buffer which is used for data writing and reading by a page of the cell array 1.

One page read data in the sense amplifier circuit 3 may be selected by a column decoder (column gates) 4 to be output to the external I/O terminal through an I/O buffer 5. Write data supplied from the I/O terminal is selected by the column decoder 4 to be loaded in the sense amplifier circuit 3. One page write data is loaded in the sense amplifier circuit 3 and held until a data write cycle is finished. Address signal is input to an address hold circuit 6 through the I/O buffer 5 and transferred to the row decoder 2 and column decoder 4.

A controller 7 outputs various internal timing signals used for controlling write and erase sequence in response to external signals such as write enable signal/WE, read enable signal/RE, address latch signal ALE, command latch signal CLE and the like. Based on these internal signals, the controller 7 executes sequence controls of data write and erase, and a data read operation. A high voltage generation circuit 8 generates various high voltages, Vpp, for data writing and erasing under the control of the controller 7.

Figure 2:
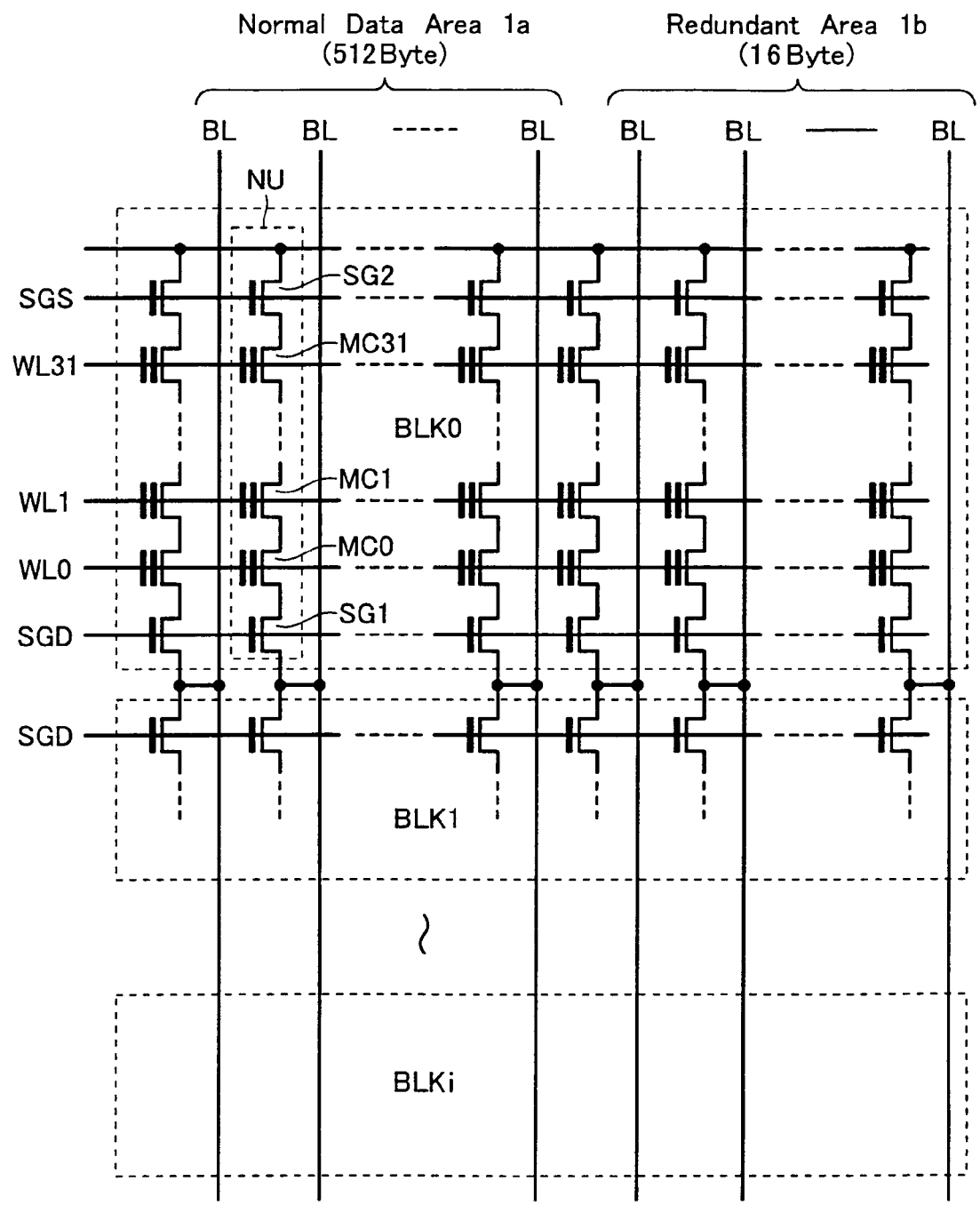
FIG. 2 shows a cell array arrangement of the flash memory.

FIG. 2 shows a detailed configuration of the cell array 1. The cell array 1 is formed of NAND cell units NU arranged therein, each of which has a plurality of (thirty two in this example) floating gate-type memory cells MC0-MC31. In detail, the NAND cell unit NU has a cell string in which plural memory cells MC0-MC31 are connected in series, a select gate transistor SG1 disposed between one end thereof and a bit line BL, and another select gate transistor SG2 disposed between the other end and a source line CELSRC. Control gates of the memory cells MC0-MC31 are connected to word lines WL0-WL31, respectively. Gates of the select gate transistors SG1 and SG2 are connected to select gate lines SGD and SGS disposed in parallel with the word lines, respectively. A group of memory cells arranged along a word line serves as one page or two pages. To simplify the explanation, it will be described for a case that the group of memory cells arranged along a word line serves as a page. A group of NAND cell units arranged in the direction of the word line serves as a block. The cell array 1 shown in FIG. 2 has a plurality of blocks BLK0-BLKi arranged in the direction of the bit line BL.

Each page of cell array 1 is divided into a normal data area 1a for storing normal data and a redundant area 1b. The normal data area 1a has a capacity of, for example, 512 Byte per page. The redundant area 1b has a capacity of, for example, 16 Byte and serves for storing ECC data for correcting an error bit of data stored in the normal data area 1a, logical address, flag for indicating whether a block is defective or not, and "the number of data erasure".

Figure 3:
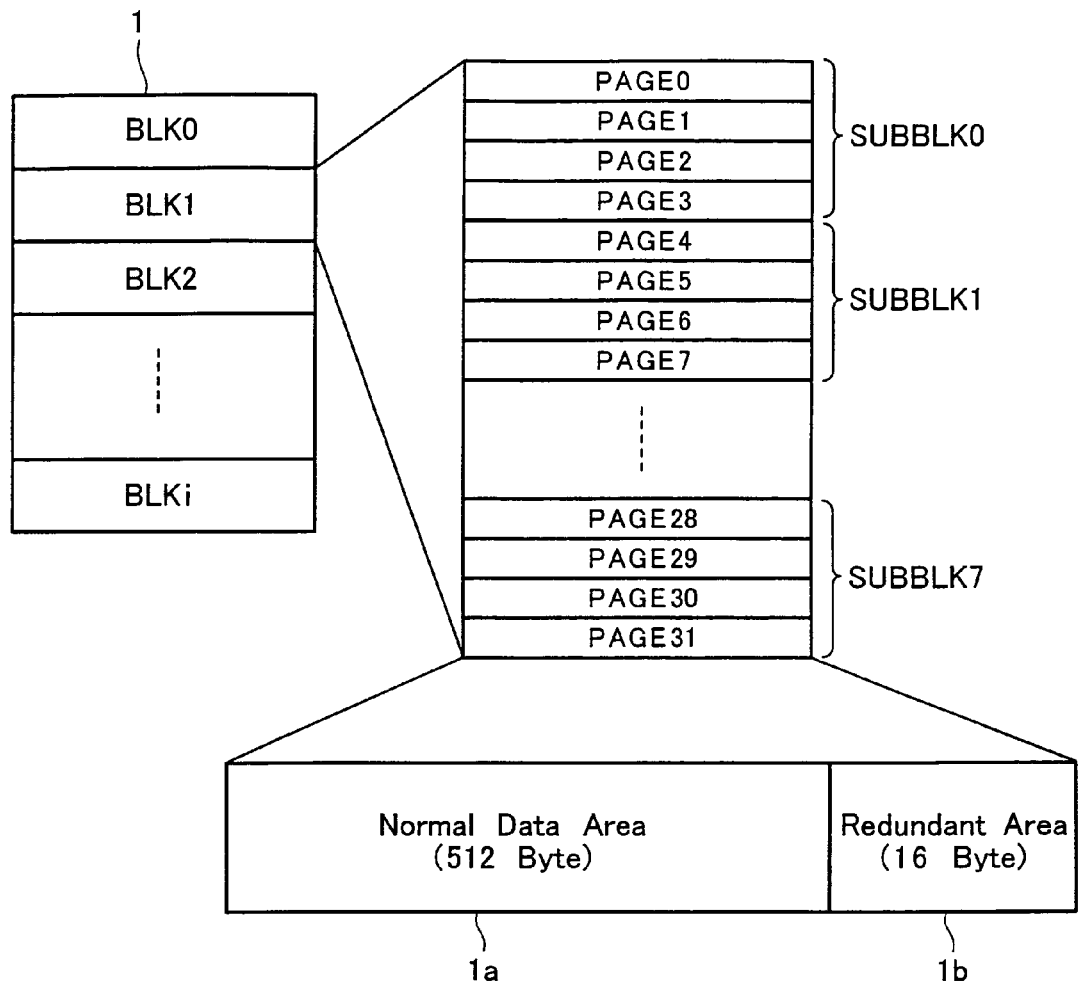
FIG. 3 shows a hieratical structure of the cell array.

FIG. 3 shows a hieratical structure of the cell array 1 as easily being understandable. Cell array 1 is divided into a plurality of blocks BLK0-BLKi in the direction of the bit line. Each block includes 32 pages, PAGE0-PAGE31, in this embodiment. Further, each block is divided into eight sub-blocks, SUBBLK0-SUBBLK7, each of which includes continuous eight pages in the direction of the bit line. And, each page is divided into normal data area 1a and redundant area 1b.

Figure 4:
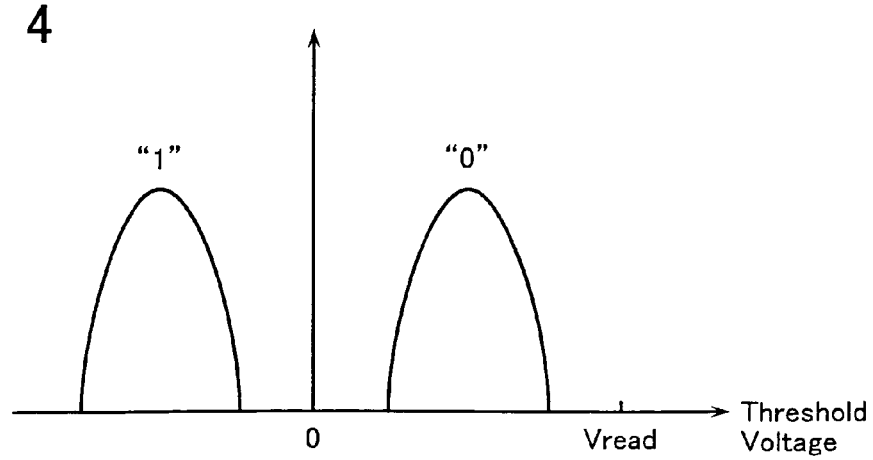
FIG. 4 shows data threshold distributions of the flash memory.

Next, write, read and erase operations of the NAND flash memory will be described bellow. Supposing that a two-value data (i.e., binary data) storing scheme is used, each memory cell MC stores, as shown in FIG. 4, data "1" (erase state) defined as a negative threshold state of the cell or data "0" defined as a positive threshold voltage state of the cell.

Data write is performed by a page. In detail, based on write data loaded in the sense amplifier circuit 3, precharge bit lines and channels of selected cells continued from the corresponding bit lines at Vdd-Vth ("1" write) and Vss ("0" write), where Vth is a threshold voltage of the select transistor SG1.

Then apply a boosted write voltage Vpgm to a selected word line. In a cell to which "0" data is applied, electron injection occurs from the channel to the floating gate by FN tunneling, whereby a "0" data state (i.e., positive threshold state) is written. In a cell to which "1" data is applied, electron injection does not occur as a result of channel potential boost by capacitive coupling. As described above, "0" and "1" are written into selected cells. At the data write time, applying an intermediate voltage Vpass to non-selected word lines in the block, it becomes possible to prevent non-selected cells from being written.

In practice, data write is performed by repeating write cycles each including a write voltage (Vpgm) application and a verify-read for verifying the write state until all write data are completely written. By use of such the write sequence control, the data threshold distribution may be obtained as shown in FIG. 3.

Data read is done by applying 0V as a read voltage to a selected word line, while applying a pass voltage Vread to non-selected word lines, which enables to turn on cells without regard to cell data, and detecting cell current on the above-described bias condition. In detail, the sense amplifier circuit 3 precharges the bit line at a certain voltage, and then detects whether the bit line is discharged or not by the selected cell, thereby sensing data "0" or "1".

Data erase is done by a sub-block in this embodiment. In detail, this "sub-block erase" is done by precharging word lines in non-selected sub-blocks (i.e., non-selected word lines) in a selected block to, for example, Vdd, thereby setting them at a floating state, while applying 0V to word lines of a selected sub-block (i.e., selected word lines), and simultaneously applying an erase voltage Vera to a p-type well on which the cell array 1 is formed. Under such the erase bias condition, cells of the selected sub-block change to have a data "1" state (erase state) as a result of electron releasing from the floating gates to the channels. In the non-selected sub-blocks, floating gates and control gates are boosted by capacitive coupling from channels, whereby cell data may be retained as it is.

Figure 5:
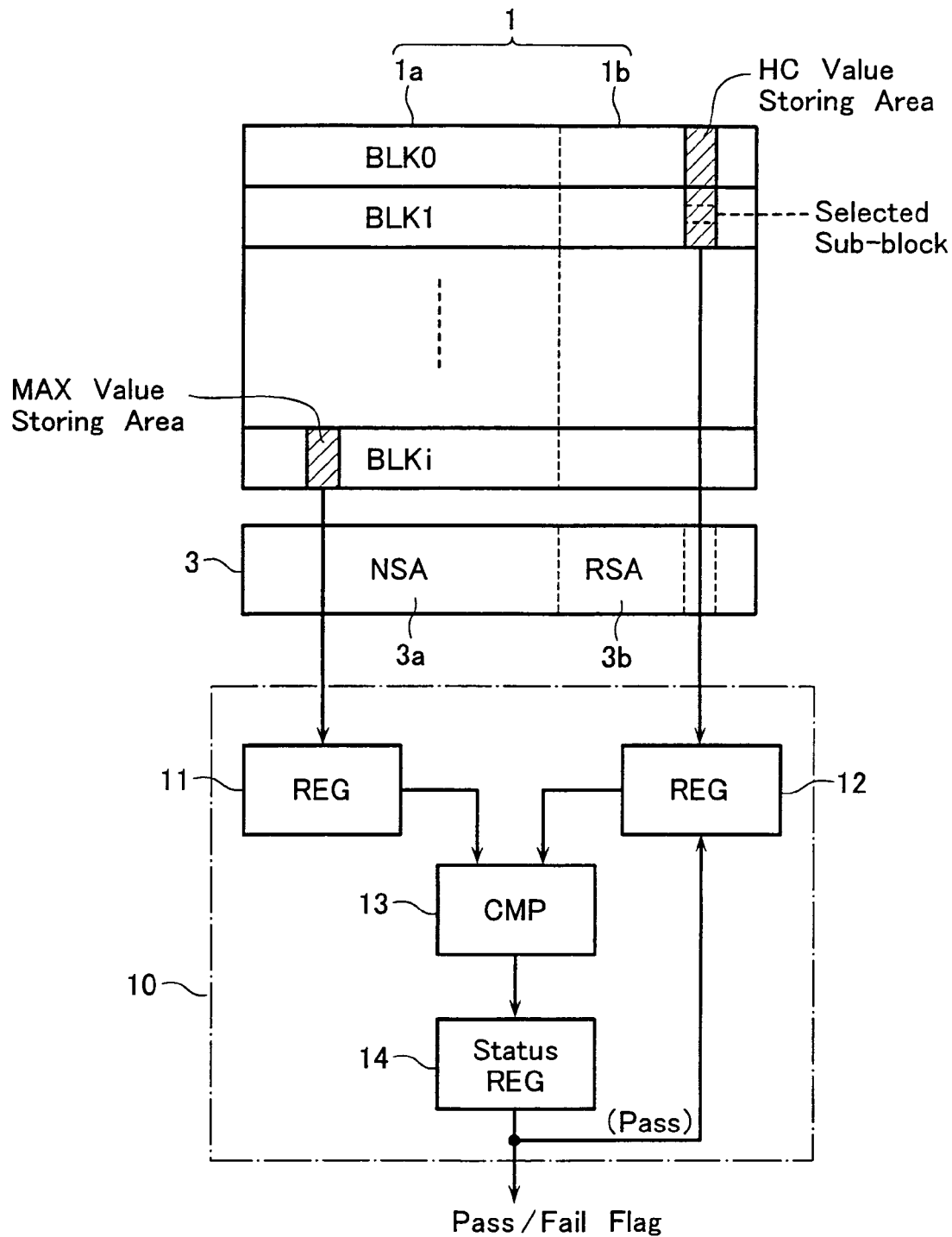
FIG. 5 shows a configuration of a data erase control system of the flash memory.

FIG. 5 shows a configuration of a data erase control system 10 in this embodiment for controlling the number of data erasure or "frequency of erasing" for each sub-block. The number of data erasure will be sometimes referred to as a "hot count (HC) value" hereinafter. An area for storing the number of data erasure (i.e., HC value) of each sub-block is set in the redundant area 1b of each sub-block as an "HC storing area". An HC value stored in the HC storing area is incremented for each sub-block erasure. The data erasure of each sub-block will be limited in such a manner that an accumulated HC value is not over a permissible maximum value.

Where the permissible maximum value MAX of the HC value is stored for the purpose of such limitation of the number of data erasure is a predetermined block. For example, supposing that a block BLKi serves as an initial setup data area for storing initial setup data which serve for initially setting operation conditions at a chip power-on time, the permissible maximum value MAX may also be written into the initial setup data area as one of such initial setup data.

As shown in FIG. 5, the erase control system 10 has a register 11 for storing the permissible maximum value MAX read out of the block BLKi and another register 12 for storing the HC value preliminarily read out of a sub-block selected in a data erase mode. Note here, the sense amplifier circuit 3 has a normal sense amplifier circuit 3a and a redundant sense amplifier circuit 3b disposed in correspondence with the normal data area 1a and redundant area 1b, respectively. The permissible maximum value MAX in the block BLKi is automatically read out at the power-on time simultaneously with other initial setup data and stored in the register 11.

The HC value in the redundant area 1b in a sub-block selected in a data erase cycle is read out to the register 12 prior to data erasure. This register 12 has a counter function. A comparator 13 is prepared for comparing the MAX value read in the register 11 with the HC value read in the register 12. This comparator 13 serves as a judgment circuit for judging whether the HC value of a sub-block subjected to data erase has reached the maximum value MAX or not. In response to the judged result, a status register 14 outputs "Pass" or "Fail" flag. When the HC value has reached the maximum value MAX, a "Fail" flag is output. In case the HC value has not reached the maximum value MAX, data erasure is performed for the selected sub-block. After this data erasure, the HC value stored in the register 12 is incremented, and an accumulated HC value is written into the selected sub-block.

Figure 6:
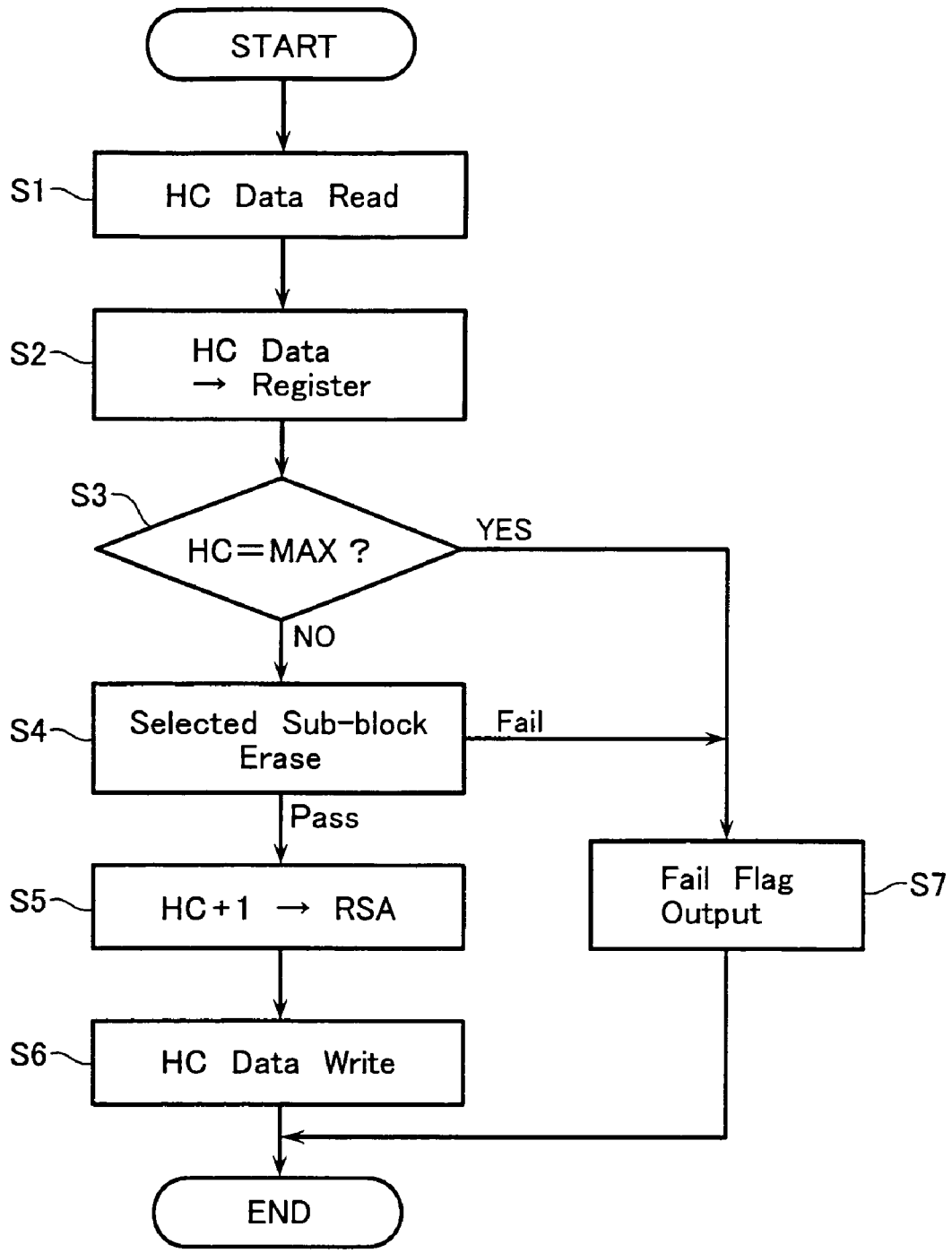
FIG. 6 shows a data erase flow of the flash memory.

FIG. 6 shows an operation flow of data erasure. A command for data erasing being issued, the controller 7 executes a check-read operation for reading the HC data in the redundant area 1b in the selected sub-block (at step S1). The HC data is read out to the redundant sense amplifier circuit 3b. Next, transfer the HC data to the register 12 (at step S2). Then, activate the comparator 13 to judge whether the accumulated HC value has reached the maximum value MAX or not (at step S3).

If the judged result is "NO", controller 7 executes data erasure for the selected sub-block (at step S4). This data erasure is done by repeating an erase voltage application and a verify-read operation for verifying that the erased cell's threshold voltage has been in a predetermined voltage region. If the data erasure is failed, output the "Fail" flag (at step S7). If data erasure is "Pass", increment the HC data and transfer it to the redundant sense amplifier circuit 3b (at step S5). That is, a renewed HC value is transferred to the redundant sense amplifier circuit 3b as a write data. Thereafter, write the renewed HC value into the selected sub-block in the redundant area 1b (at step S6), and the sub-block erasing operation is ended.

If the judged result at the step S3 is "YES", controller 7 outputs a "Fail" flag to the external of the chip without executing the erase operation (at step S7). In response to this "Fail" flag, every user may change the sub-block subjected to data rewrite. It is desirable to set the sub-block, in which the number of data erasure has reached to the permissible maximum value MAX, in a rewrite-inhibition state until when data refresh is performed.

Every user may decide to do data refresh or not in response to the status flag. For example, it is possible to decide to perform data refresh after all of the numbers of data erasure in the entire sub-blocks in a block having reached to the permissible maximum value. In this case, all data in the normal data area 1a in the selected block are read out. Then, after having temporally stored these data in the external controller, or after having copy-written those into another block, the selected block is erased at a time. Thereafter, these sheltered data are written into the selected block again. At this write time, the HC value storing area in the redundant area 1b is held at an erase state of all "1" (i.e., an initial state of HC value data). As a result, it becomes possible to initialize the HC value, and simultaneously rewrite data in a state that the influence of stresses accumulated by repeating data erasures is removed.

It is also possible to perform data refresh under other conditions. For example, when the amount of sub-blocks, which are set in a rewrite-inhibition state in a block, has reached a certain value, the block may be subjected to data refresh.

As described above, according to this embodiment, the number of data erasure in a block is controlled for each sub-block in the chip, and data erase operations are limited for each sub-block such that the number of data erasure is not over a predetermined value. Therefore, it is possible to suppress the stress due to data rewrite, thereby preventing cell data from being destroyed. In detail, supposing that the permissible maximum value MAX of the HC value is set as MAX=8 in the configuration that one block is composed of eight sub-blocks as shown in FIG. 3, the number of data erasure is limited to eight for each sub-block, and limited to 8×8=64 for the block. In other words, according to this embodiment, the data rewrite operations may be averaged among the sub-blocks in a block, and this fact prevents data rewrite operations from being concentrated in a certain sub-block.

Although one block is divided into a plurality of sub-blocks with the same capacity in the embodiment described above, it is permissible that one or more sub-blocks have different capacities from the others in a block. In such a case, it is preferable to set different permissible maximum values for the respective sub-blocks with different capacities for averaging the rewrite stresses among such sub-blocks. Further, it should be appreciated that a sub-block is composed of a page.

As an embodiment, an electric card using the non-volatile semiconductor memory device according to the above-described embodiment of the present invention and an electric device using the card will be described bellow.

Figure 7:
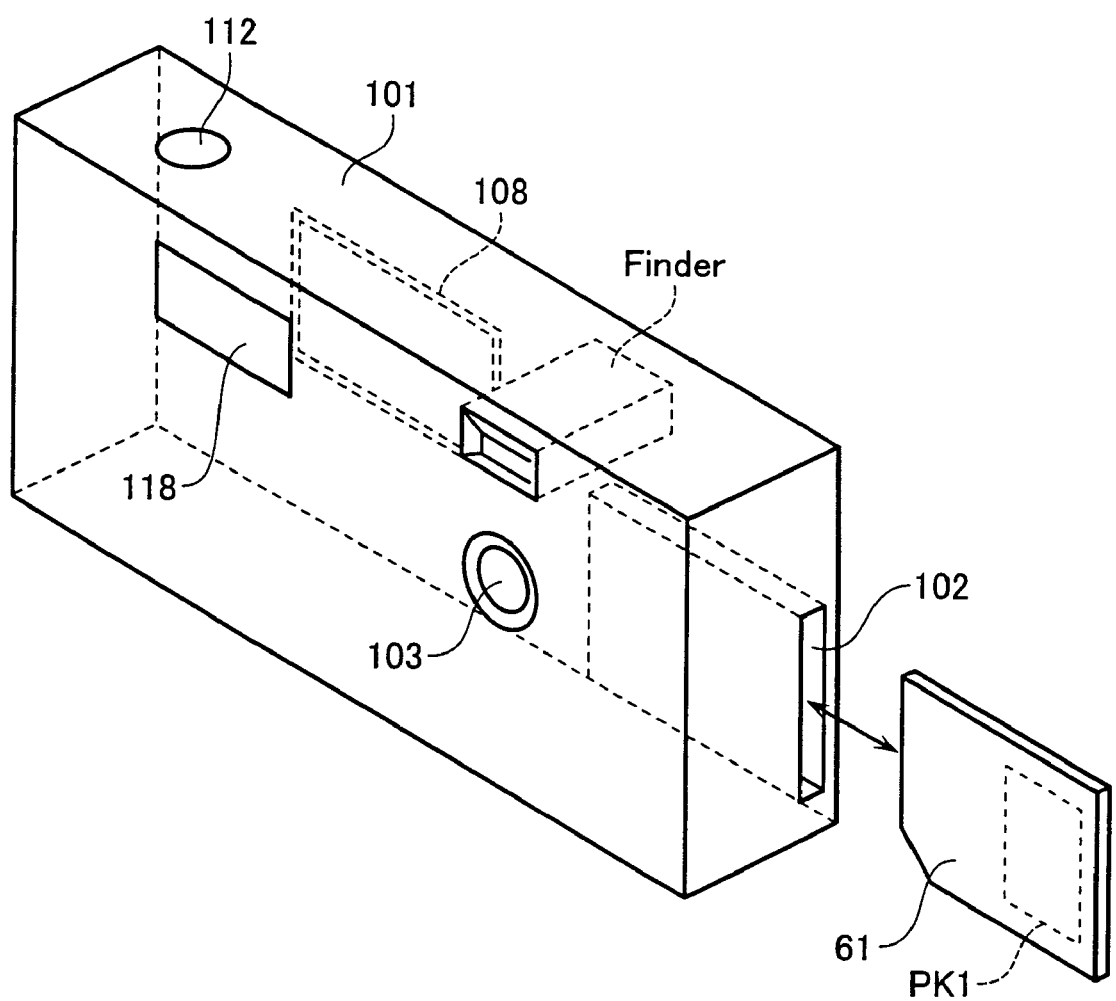
FIG. 7 shows another embodiment applied to a digital still camera.

FIG. 7 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 8:
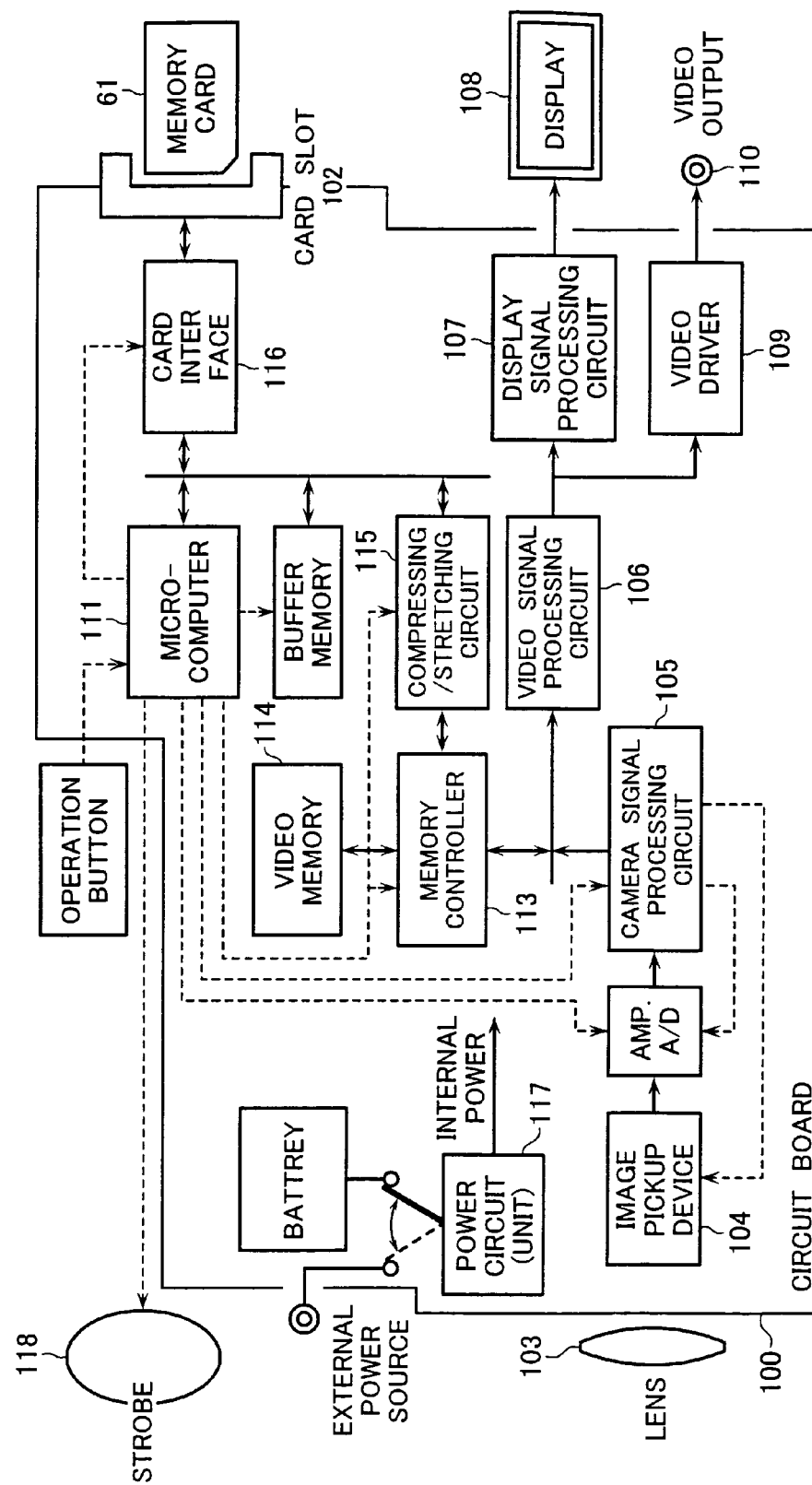
FIG. 8 shows the internal configuration of the digital still camera.
Figure 9A:
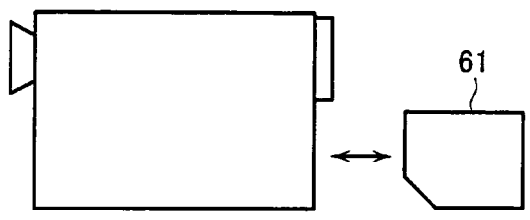
FIGS. 9A to 9J show other electric devices to which the embodiment is applied.
Figure 9F:
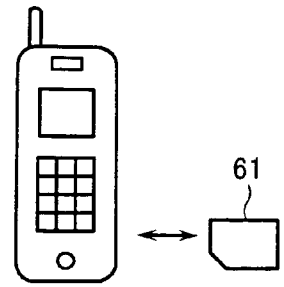
Figure 9B:
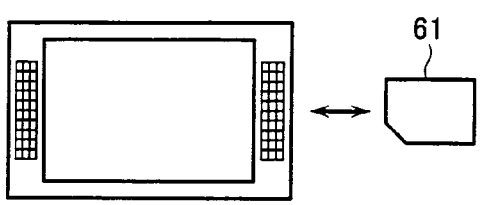
Figure 9G:
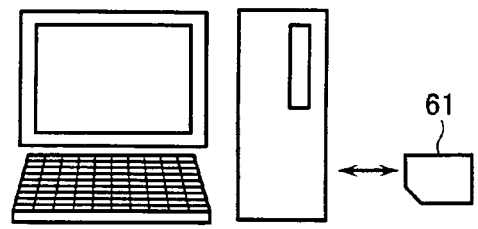
Figure 9C:
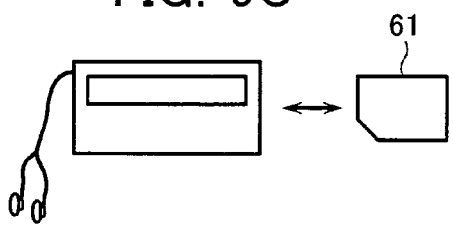
Figure 9H:
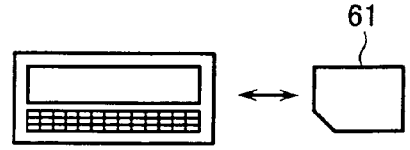
Figure 9D:
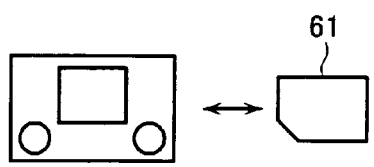
Figure 9I:
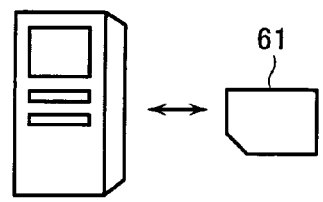
Figure 9E:
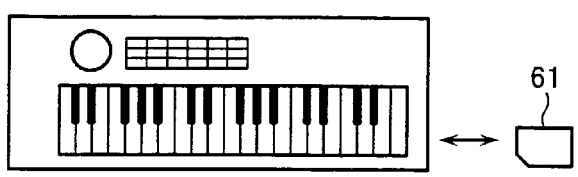
Figure 9J:
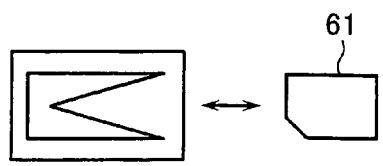

FIG. 8 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 9A to 9J, as well as in portable electric devices. That is, the electric card can also be used in a video camera shown in FIG. 9A, a television set shown in FIG. 9B, an audio apparatus shown in FIG. 9C, a game apparatus shown in FIG. 9D, an electric musical instrument shown in FIG. 9E, a cell phone shown in FIG. 9F, a personal computer shown in FIG. 9G, a personal digital assistant (PDA) shown in FIG. 9H, a voice recorder shown in FIG. 9I, and a PC card shown in FIG. 9J.

This invention is not limited to the above-described embodiment. For example, while it has been explained in case that the flash memory is NAND-type one, it should be appreciated that this invention may be applied to other flash memories, for example, of AND-type, virtual ground-type and the like.

What is claimed is:

1. A non-volatile semiconductor memory device comprising:
a cell array having electrically rewritable and non-volatile memory cells arranged therein, said cell array being divided into a plurality of blocks, each said block being divided into a plurality of sub-blocks each comprising one or plural and continuous pages; and
a controller for controlling data erasure of said cell array in a way that each said sub-block serves as a unit of data erasure, each said sub-block in said cell array storing the number of data erasure which is renewed by each data erasure, and the number of data erasure is limited for each said sub-block to a permissible maximum value stored in a certain block in said cell array;
a first register for storing said permissible maximum value read out of said certain block;
a second register for storing the number of data erasure read out of a selected sub-block selected for data erasing before data erasure; and
a judgment circuit for judging whether the number of data erasure read from said second register has reached said permissible maximum value or not, and wherein
in a case the number of data erasure has not reached said permissible maximum value, the number of data erasure is renewed and written into said selected sub-block after having erased said selected sub-block.

2. The non-volatile semiconductor memory device according to claim 1, wherein
said cell array comprises a normal data area in which normal data read and write are performed and a redundant area, the number of data erasure is stored in said redundant area.

3. The non-volatile semiconductor memory device according to claim 1, wherein
said certain block serves as a data area for storing initial setup data which are automatically read out at a power-on time, and wherein
said permissible maximum value is stored in said data area as one of said initial setup data.

4. The non-volatile semiconductor memory device according to claim 1, wherein
a judged result of said judgment circuit is output to the external of the chip as a status flag.

5. The non-volatile semiconductor memory device according to claim 1, wherein
said cell array comprises NAND cell units arranged therein each having plural memory cells connected in series with control gates thereof being connected to different word lines, one page being defined as a group of memory cells connected to a word line, one block being defined as a group of NAND cell units arranged in the direction of said word lines.

6. An electric card equipped with a non-volatile semiconductor memory device defined in claim 1.

7. An electric device comprising:
a card interface;
a card slot connected to said card interface; and
an electric card defined in claim 6 and electrically connectable to said card slot.

8. The electric device according to claim 7, wherein said electric device is a digital still camera.

9. A non-volatile semiconductor memory device comprising:
a cell array comprising NAND cell units arranged therein each having a plurality of electrically rewritable and non-volatile memory cells connected in series with control gates thereof being connected to different word lines;
said cell array being divided into plural blocks each being divided into plural sub-blocks, each sub-block comprising one or plural and continuous pages, one page being defined as a group of memory cells connected to a word line, one block being defined as a group of NAND cell units arranged in the direction of said word lines;
a controller for controlling data erasure of said cell array in a way that each said sub-block serves as a unit of data erasure; and
a data erase control system configured to renew the number of data erasure stored in each said sub-block after having erased each said sub-block, and limit the number of data erasure for each said sub-block to a permissible maximum value stored in a certain block in said cell array, said data erase control system comprising:
a first register for storing said permissible maximum value read out of said certain block;
a second register for storing the number of data erasure read out of a selected sub-block selected for data erasing before data erasure; and
a judgment circuit for judging whether the number of data erasure read from said second register has reached said permissible maximum value or not, and wherein
in a case the number of data erasure has not reached said permissible maximum value, the number of data erasure is renewed and written into said selected sub-block after having erased said selected sub-block.

10. The non-volatile semiconductor memory device according to claim 9, wherein
said cell array comprises a normal data area in which normal data read and write are performed and a redundant area, the number of data erasure being stored in said redundant area.

11. The non-volatile semiconductor memory device according to claim 9, wherein
said certain block serves as a data area for storing initial setup data which are automatically read out at a power-on time, and wherein
said permissible maximum value is stored in said data area as one of said initial setup data.

12. The non-volatile semiconductor memory device according to claim 9, wherein
a judged result of said judgment circuit is output to the external of the chip as a status flag.

13. An electric card equipped with a non-volatile semiconductor memory device defined in claim 9.

14. An electric device comprising:
a card interface;
a card slot connected to said card interface; and
an electric card defined in claim 13 and electrically connectable to said card slot.

15. The electric device according to claim 14, wherein said electric device is a digital still camera.

* * * * *